(12) United States Patent
Yoshida et al.

(10) Patent No.: US 11,522,562 B2
(45) Date of Patent: Dec. 6, 2022

(54) ERROR CORRECTING DECODING DEVICE AND ERROR CORRECTING DECODING METHOD

(71) Applicant: MITSUBISHI ELECTRIC CORPORATION, Tokyo (JP)

(72) Inventors: Hideo Yoshida, Tokyo (JP); Yoshiaki Konishi, Tokyo (JP); Kenji Ishii, Tokyo (JP); Takashi Sugihara, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 17/365,126

(22) Filed: Jul. 1, 2021

(65) Prior Publication Data

US 2021/0328602 A1    Oct. 21, 2021

Related U.S. Application Data

(63) Continuation of application No. PCT/JP2019/006837, filed on Feb. 22, 2019.

(51) Int. Cl.
*H03M 13/00* (2006.01)
*H03M 13/29* (2006.01)
(Continued)

(52) U.S. Cl.
CPC ..... *H03M 13/2948* (2013.01); *H03M 13/255* (2013.01); *H03M 13/2915* (2013.01); *H03M 13/43* (2013.01)

(58) Field of Classification Search
None
See application file for complete search history.

(56) References Cited

U.S. PATENT DOCUMENTS 7,137,060 B2   11/2006   Yu et al.
7,783,958 B1 *  8/2010   Eidson ................. H03G 3/3068
                                                                714/776
(Continued)

FOREIGN PATENT DOCUMENTS

EP      1 655 845 A1    5/2006
JP      2005-223440 A   8/2005
(Continued)

OTHER PUBLICATIONS

Extended European Search Report for European Application No. 19916516.8. dated Dec. 15, 2021.

(Continued)

*Primary Examiner* — Mujtaba M Chaudry
(74) *Attorney, Agent, or Firm* — Birch, Stewart, Kolasch & Birch, LLP

(57) ABSTRACT

Provided is an error correction decoding device including an inner code iterative decoding circuit, a parameter generation circuit, and a first control circuit. The first control circuit is configured to: receive, as parameters, a threshold and a maximum iteration count which are generated by the parameter generation circuit; and compare, when an iteration count does not reach the maximum iteration count, a non-zero-value count sequentially output from the inner code iterative decoding circuit and the threshold set for each iteration (Continued)

count, and stop an iterative operation by the inner code iterative decoding circuit when a result of the comparison satisfies a stopping condition set in advance.

8 Claims, 5 Drawing Sheets

(51) Int. Cl.
*H03M 13/25* (2006.01)
*H03M 13/43* (2006.01)

(56) References Cited

U.S. PATENT DOCUMENTS

| | | | |
|---|---|---|---|
| 8,924,821 B2 | 12/2014 | Deng et al. | |
| 9,564,927 B2* | 2/2017 | Fonseka | H03M 13/036 |
| 2005/0204272 A1 | 9/2005 | Yamagishi | |
| 2009/0094470 A1 | 4/2009 | Gao et al. | |
| 2009/0187802 A1 | 7/2009 | Yamagishi | |
| 2009/0231745 A1* | 9/2009 | Venkataramani | G11B 20/10287 360/39 |
| 2011/0107178 A1* | 5/2011 | Nakamura | G11B 20/1833 714/E11.032 |
| 2011/0246849 A1 | 10/2011 | Rault et al. | |
| 2014/0075263 A1 | 3/2014 | Ku et al. | |
| 2016/0352362 A1* | 12/2016 | Fonseka | H03M 13/1102 |
| 2017/0324430 A1* | 11/2017 | Han | H03M 13/3746 |

FOREIGN PATENT DOCUMENTS

| | | |
|---|---|---|
| JP | 2008-193460 A | 8/2008 |
| JP | 2008-544692 A | 12/2008 |
| JP | 2009-177416 A | 8/2009 |

OTHER PUBLICATIONS

Alleyne et al., "On Stopping Criteria for Low-Density Parity-Check Codes," 2008 6th International Symposium on Communication System, Networks and Digital Signal Processing, Jul. 25, 208, pp. 633-637.

Futaki et al., "Low-Density Parity-Check (LD PC) Coded 0 FD M Systems," VTC Fall 2001, No. 01CH37211, 2001, pp. 82-86.

Miyata et al., "A Triple-Concatenated FEC using Soft-Decision Decoding for 100 GB/s Optical Transmission," Optical Society of America, Proc. OFC/NFOEC, 2010, pp. 1-3.

Mohsenin et al., "Low Power LDPC Decoder with Efficient Stopping Scheme for Undecodable Blocks," ISCAS, 2011, pp. 1780-1783.

Shin et al., "A Stopping Criterion for Low-Density Parity-Check Codes," IEEE 65th Vehicular Technology Conference VTC2007-Spring, Apr. 25, 2007, pp. 1529-1533.

Sugihara et al., "A Spatially-coupled Type LDPC Code with an NCG of 12 dB for Optical Transmission beyond 100 GB/s," Proc. OFC/NFOEC 2013, OM2B.4, 2013, pp. 1-3.

* cited by examiner

ERROR CORRECTING DECODING DEVICE AND ERROR CORRECTING DECODING METHOD

CROSS REFERENCE TO RELATED APPLICATION

This application is a Continuation of PCT International Application No. PCT/JP2019/006837, filed on Feb. 22, 2019, which is hereby expressly incorporated by reference into the present application.

TECHNICAL FIELD

The present invention relates to an error correction decoding device and an error correction decoding method which are configured to use iterative decoding processing on a low-density parity-check code.

BACKGROUND ART

In general, a high-speed transmission device, for example, an optical transmission system, employs an error correction code as an effective method for achieving a high transmission capacity and long-distance transmission. The error correction code is a technology used in, for example, a wired/wireless communication system and a storage device. The error correction code is a technology for adding a redundant bit to digital data to be transmitted on a transmission side, to thereby enable correction of a bit error even when the error has occurred in received data. The "bit error" is hereinafter simply referred to as "error".

As error correction encoding/decoding methods, various kinds of methods are proposed, such as Hamming codes, Bose-Chaudhuri-Hocquenghem (BCH) codes, Reed-Solomon (RS) codes, and product codes or concatenated codes that are combinations thereof.

It is possible to detect and correct an error that has occurred in a transmission path by employing an error correction code. However, there is a limitation on the number of error bits that can be corrected. Further, the number of error bits that can be corrected differs depending on the error correction performance and decoding method of an error correction encoding method.

In an error correction code, transmission data containing an overhead and other information forming a frame is called "information bit". Further, a redundant bit added to an information bit is called "parity bit". The parity bit is calculated from an information bit by a calculation method that differs depending on the error correction encoding method. Further, a bit string obtained by combining an information bit and a parity bit is called "codeword".

In an error correction code called "block code", a parity bit is calculated from an information bit in units of the number of bits set in advance. That is, the number of information bits and the number of parity bits are determined in advance within one codeword, and are called "information bit length" and "parity bit length", respectively. Further, the number of bits of a codeword is called "code length".

A core/metro optical transfer system to be used for a submarine cable and intercity communication, for example, has a significant demand for expanding the transmission capacity and transmission distance. As a result, sophisticated error correction codes are being employed and proposed for high-speed transmission at 1 Tbps, for example.

In recent years, a low-density parity-check (LDPC) code has been widely used as the error correction code. The LDPC code is a block code defined by a sparse parity-check matrix with a small number of non-zero elements.

With the LDPC code, correction is possible by using a log-likelihood ratio (LLR) or other types of soft-decision information, even in a transmission path prone to errors, and a decoding method thereof is implementable in high-rate transmission as high as several ten Gbps to 1 Tbps. For that reason, the LDPC code is used in many core/metro optical transfer systems.

On the other hand, the LDPC code tends to be not as effective for correction in a situation in which an error before correction is relatively small as a correction result obtained in a situation in which an error before correction is large. This phenomenon is called "error floor".

To address this phenomenon, there has been used a configuration in which the LDPC code serves as an inner code, one of the Hamming codes described above, one of the BCH codes described above, or one of the RS codes described above, or a product code, a concatenated code, or the like that is a combination of those codes serves as an outer code, and the inner code and the outer code are combined (see, for example, Non-Patent Literature 1).

In Non-Patent Literature 1, there is described an encoding method that concatenates a BCH code which is a block code to an LDPC code having a long code length and an accordingly high correction capability.

A configuration in which interleaving is executed between the LDPC code and the block code is employed in many cases. With this configuration, an error that remains uncorrected with one of a plurality of LDPC codes can be corrected by dispersing the error that remains uncorrected with the LDPC code among a plurality of outer codes that are block codes.

Decoding processing of the LDPC code accomplishes high error tolerance by executing iterative processing of row operation and column operation with the use of soft-decision information. A decoding circuit of an error correction circuit is therefore larger in circuit scale than in the case of the block code used as the outer code. The decoding circuit of the error correction circuit requires a high-speed clock for iterative operation processing, which also increases the power consumption.

In contrast, there is a decoding method in which a syndrome check based on a parity-check matrix is performed on a decoding result obtained by column operation of iterative processing, detection of all-zero through the syndrome check is regarded as a sign of the completion of decoding, and decoding processing is stopped at that point (see, for example, Non-Patent Literature 2).

There is also a decoding method in which decoding processing in decoding of an LDPC code is stopped when the LDPC code is determined uncorrectable by determination of the non-zero-value count of syndromes in three consecutive iterations (see, for example, Non-Patent Literature 3).

CITATION LIST

Non Patent Literature

[NPL 1] K. Sugihara, Y. Miyata, T. Sugihara, K. Kubo, H. Yoshida, W. Matsumoto, and T. Mizuochi, "A spatially-coupled type LDPC code with an NCG of 12 dB for optical transmission beyond 100 Gb/s", Proc. OFC/NFOEC 2013, OM2B.4 (2013).

[NPL 2] Hisashi Futaki and Tomoaki Ohtsuki, "Low-Density Parity-Check (LDPC) Coded OFDM Systems", in VTC Fall 2001, No. 01CH37211 (2001).

[NPL 3] Tinoosh Mohsenin, Houshmand Shirani-mehr, and Bevan Baas, "Low power LDPC decoder with efficient stopping scheme for undecodable blocks", ISCAS 2011 (2011).

SUMMARY OF INVENTION

Technical Problem

However, the related art has the following problems.

As described in Non-Patent Literature 1, a concatenated code of a block code that is a BCH code or the like is used in many LDPC codes. In Non-Patent Literature 1, however, there is no description of a technology for stopping decoding processing of the LDPC code in the middle of the run.

In Non-Patent Literature 2 and Non-Patent Literature 3, on the other hand, technologies of stopping decoding processing of the LDPC code in the middle of the run are described. However, there is no mention of decoding processing to be executed subsequently thereto with a block code in Non-Patent Literature 2 and Non-Patent Literature 3.

In addition, in Non-Patent Literature 2, a condition for stopping the decoding processing is that a non-zero-value count be 0 in a parity check, which indicates that a code sequence after correction is an LDPC code sequence, and iterative decoding is executed until the non-zero-value count reaches 0 as long as a maximum iteration count set in advance is not exceeded. There may accordingly be an error that is uncorrectable despite the maximum number of iterations, which consumes large power, and even by correction with the subsequent block code.

There is also a case in which iterative decoding processing is executed in order to correct a remaining error correctable in correction that uses the subsequent block code and consumes relatively small power. Further, iterative decoding processing may be executed in order to correct an error in a parity bit part of the LDPC code sequence which does not affect decoding with the subsequent block code.

In Non-Patent Literature 3, when there is an error that is uncorrectable despite the maximum number of iterations, which consumes large power, and even by correction with the subsequent block code, decoding processing cannot be stopped until the condition that at least three iterations be executed is satisfied as a condition for stopping the decoding processing in that case. Long processing time is consequently spent before the decoding processing is stopped.

The present invention has been made to solve those problems, and an object of the present invention is therefore to obtain an error correction decoding device and an error correction decoding method in which power consumption in decoding processing is suppressed.

Solution to Problem

According to one embodiment of the present invention, there is provided an error correction decoding device including: an iterative decoding circuit configured to execute iterative decoding processing for an LDPC code, sequentially output a temporary hard-decision decoding result for each iteration count, and to sequentially output a non-zero-value count that is obtained by executing a parity check for the temporary hard-decision decoding result; a parameter generation circuit configured to generate, as parameters for executing the iterative decoding processing, a threshold set for each iteration count to be compared to the non-zero-value count, and a maximum iteration count that is a maximum number of times of iteration of execution of the iterative decoding processing; and a first control circuit configured to control iterative operation of the iterative decoding circuit, wherein the first control circuit is configured to: receive, as the parameters, the threshold and the maximum iteration count which are generated by the parameter generation circuit; stop the iterative operation by the iterative decoding circuit when an iteration count of the iterative decoding processing executed by the iterative decoding processing reaches the maximum iteration count; and compare, when the iteration count does not reach the maximum iteration count, the non-zero-value count sequentially output from the iterative decoding circuit and the threshold set for each iteration count, and stop the iterative operation by the iterative decoding circuit when a result of the comparison satisfies a stopping condition set in advance.

Further, according to one embodiment of the present invention, there is provided an error correction decoding method which is executed by the error correction decoding device of the present invention, the error correction decoding method including: an iterative decoding step of executing iterative decoding processing for an LDPC code, sequentially outputting a temporary hard-decision decoding result for each iteration count, and sequentially outputting a non-zero-value count that is obtained by executing a parity check for the temporary hard-decision decoding result; a parameter generation step of generating, as parameters for executing the iterative decoding processing, a threshold set for each iteration count to be compared to the non-zero-value count, and a maximum iteration count that is a maximum number of times of iteration of execution of the iterative decoding processing; a parameter reception step of receiving, as the parameters, the threshold and the maximum iteration count which are generated in the parameter generation step; a normal stop step of stopping the iterative operation executed in the iterative decoding step when an iteration count of the iterative decoding processing executed in the iterative decoding step reaches the maximum iteration count; and a halfway stop step of comparing, when the iteration count is below the maximum iteration count, the non-zero-value count sequentially output in the iterative decoding step and the threshold set for each iteration count, and stopping the iterative operation executed in the iterative decoding step when a result of the comparison satisfies a stopping condition set in advance.

Advantageous Effects of Invention

According to the present invention, the error correction decoding device and the error correction decoding method in which power consumption in the decoding processing is suppressed can be obtained.

DESCRIPTION OF EMBODIMENTS

An error correction decoding device and an error correction decoding method according to preferred embodiments of the present invention are described below with reference to the drawings.

First Embodiment

Figure 1:
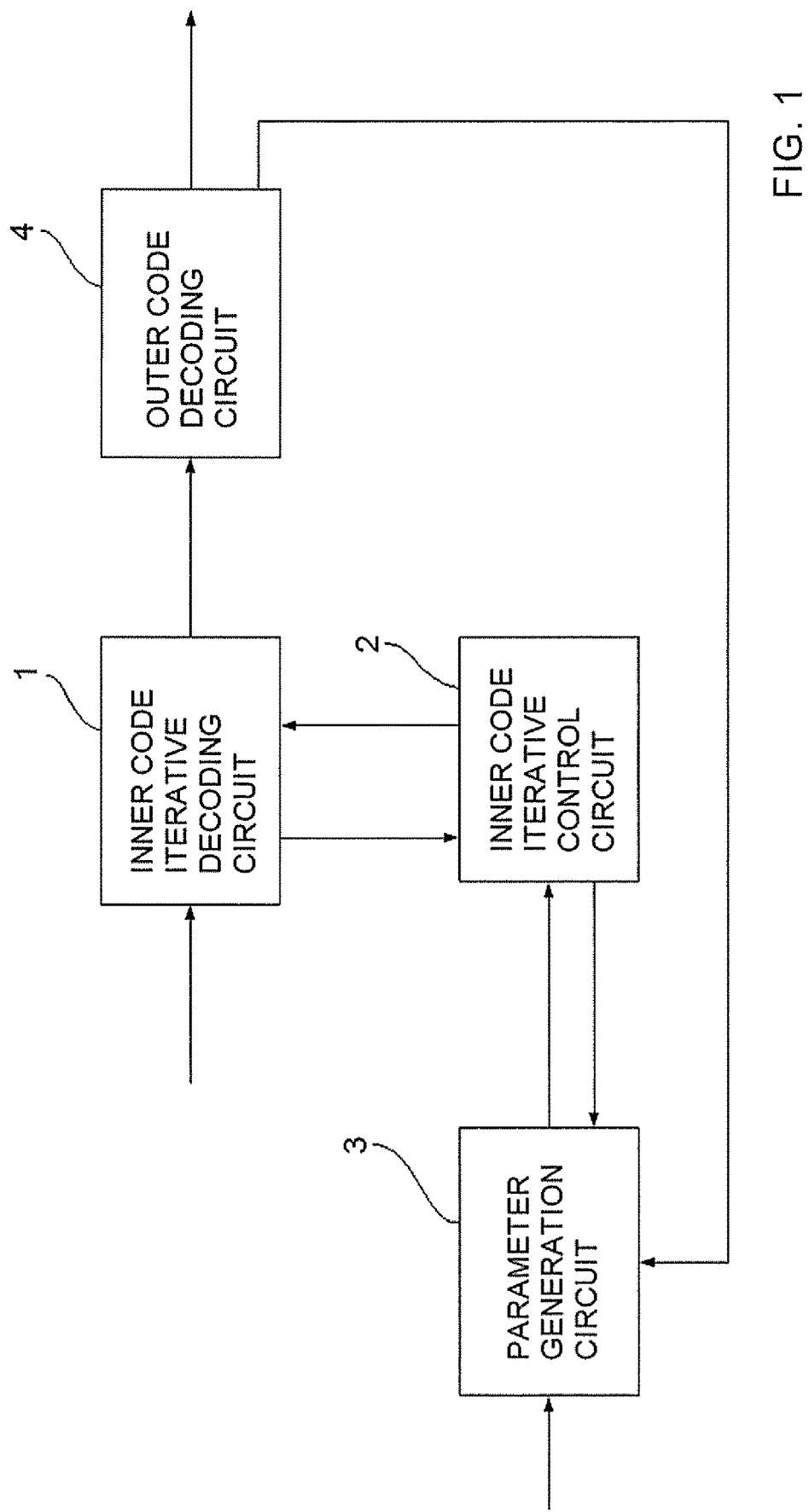
FIG. 1 is a block diagram for illustrating a configuration example of an error correction decoding device according to a first embodiment of the present invention.

FIG. 1 is a block diagram for illustrating a configuration example of an error correction decoding device according to a first embodiment of the present invention. In FIG. 1, a configuration of the error correction decoding device using a concatenated code that has an LDPC code as an inner code and a BCH code as an outer code is illustrated as an example. The error correction decoding device illustrated in FIG. 1 includes an inner code iterative decoding circuit 1, an inner code iterative control circuit 2, a parameter generation circuit 3, and an outer code decoding circuit 4.

The inner code iterative decoding circuit 1 is an iterative decoding circuit configured to perform iterative decoding processing on an LDPC code. The inner code iterative control circuit 2, on the other hand, is a first control circuit configured to control iterative operation of the inner code iterative decoding circuit 1. From the inner code iterative decoding circuit 1, a non-zero-value count S of a parity check based on a decoding result which is temporarily determined for each round of iteration is sequentially output to be handed to the inner code iterative control circuit 2.

The parameter generation circuit 3 configured to generate a parameter for performing iterative control is connected to the inner code iterative control circuit 2.

The outer code decoding circuit 4 is connected downstream of the inner code iterative decoding circuit 1 to correct an error that remains in the result of decoding executed by the inner code iterative decoding circuit 1. In addition to correcting the remaining error and outputting the result of the correction, the outer code decoding circuit 4 outputs, as correction information, information including the number of corrected bits or notification of an uncorrectable state. The output related to the correction information from the outer code decoding circuit 4 is fed back to the parameter generation circuit 3 as well.

Figure 2:
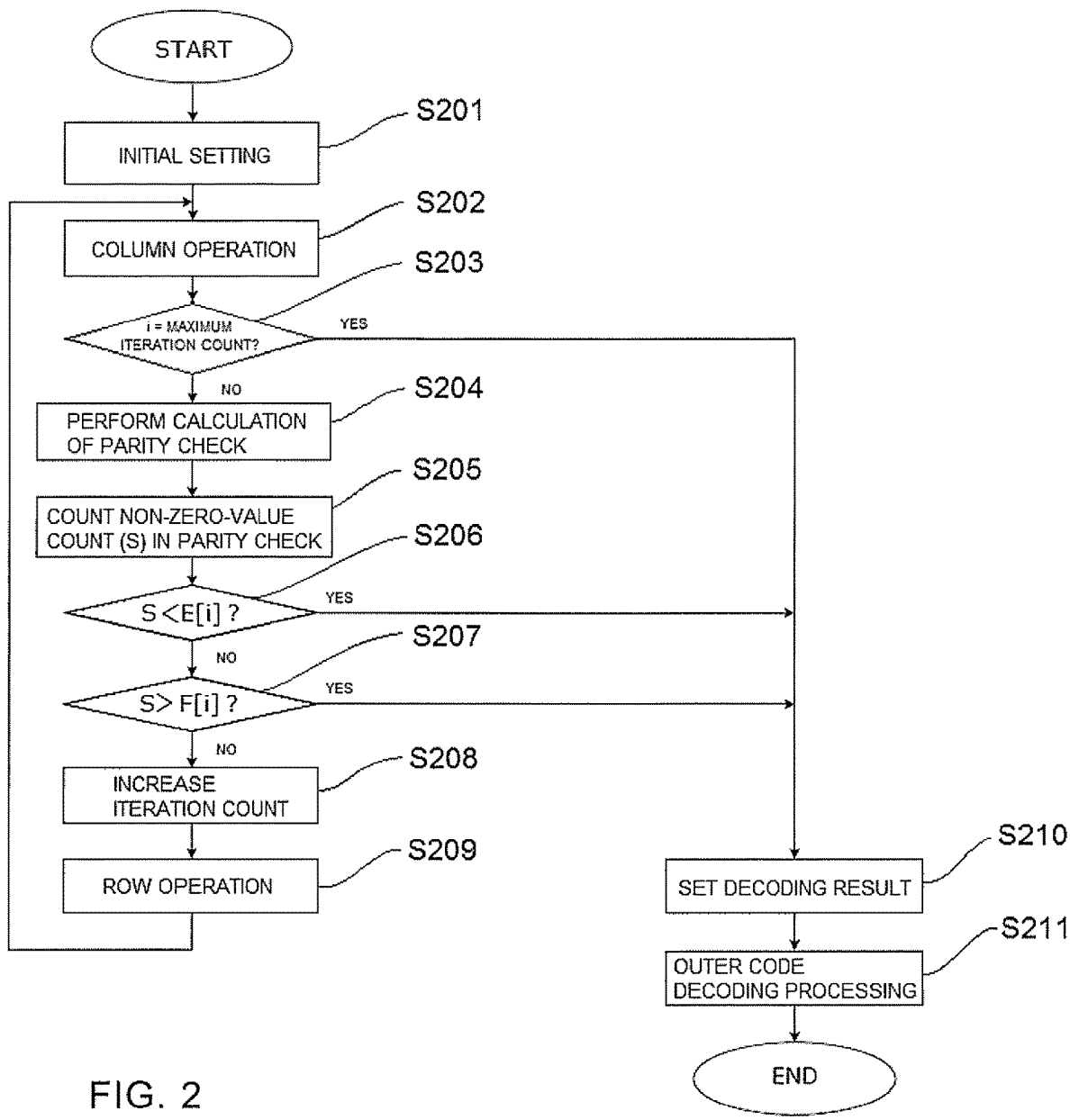
FIG. 2 is a flow chart for illustrating a series of processing steps to be executed by the error correction decoding device according to the first embodiment of the present invention which is illustrated in FIG. 1.

FIG. 2 is a flow chart for illustrating a series of processing steps to be executed by the error correction decoding device according to the first embodiment of the present invention which is illustrated in FIG. 1. More specifically, a series of processing steps to be executed by the components in the configuration of FIG. 1, namely, the inner code iterative decoding circuit 1, the inner code iterative control circuit 2, the parameter generation circuit 3, and the outer code decoding circuit 4, is illustrated in FIG. 2.

The flow chart illustrated in FIG. 2 starts with the reception of an LDPC code sequence that is an inner code by the inner code iterative decoding circuit 1. After the inner code iterative decoding circuit 1 receives all pieces of LLR information of the LDPC code sequence, the error correction decoding device executes initial setting in Step S201.

Specifically, initialization of each node is executed in the inner code iterative decoding circuit 1. In the inner code iterative control circuit 2, an iteration count "i" is set to 0. The parameter generation circuit 3 generates, in advance, as parameters for performing iterative control, a maximum iteration count and a threshold to be used for determination of whether to stop iterative processing for each round of iteration.

Specifically, the parameter generation circuit 3 generates the maximum iteration count and the threshold based on the code length of the input LDPC code, the parity bit length, performance characteristics expected of the code sequence, throughput, and a predicted transmission state.

The parameter generation circuit 3 receives the correction information provided by the outer code decoding circuit 4, which is described later, and can update the maximum iteration count and the threshold accordingly each time iterative decoding processing is sequentially executed.

The parameter generation circuit 3 transmits the initially set parameters related to the maximum iteration count and the threshold to the inner code iterative control circuit 2. The initial setting of the parameters related to the maximum iteration count and the threshold may be executed before the reception of the LDPC code sequence.

The parameters related to the threshold to be used for the determination of whether to stop the iterative processing include a threshold parameter F[i] to be used for the determination of uncorrectability and a threshold parameter E[i] to be used for the determination of correctability in decoding processing of the subsequent block code.

The threshold parameter F[i] corresponds to a first threshold and the threshold parameter E[i] corresponds to a second threshold. The threshold parameter F[i] and the threshold parameter E[i] may be used both or alone. The magnitude relationship between the parameters is "F[i]>E[i]" in view of conditions to be controlled.

After the initial conditions are set in Step S201, the inner code iterative decoding circuit 1 executes column (variable node) operation in Step S202 as decoding processing of the LDPC code. A temporary hard-decision decoding result is obtained in this step as well. The temporary hard-decision decoding result at the iteration count i=0 is the very hard-decision result of the received LDPC code sequence.

Step S202 and subsequent steps up through Step S209 described later is repeatedly executed. In Step S203, when it is determined that the iteration count "i" matches the set maximum iteration count, the inner code iterative control circuit 2 causes the iterative processing by the inner code iterative decoding circuit 1 to end, and proceeds to processing of Step S210 and subsequent steps.

When it is determined that the iteration count "i" is lower than the set maximum iteration count, on the other hand, the inner code iterative control circuit 2 proceeds to processing of Step S204. In Step S204, the inner code iterative decoding circuit 1 performs calculation of a parity check for the temporary hard-decision decoding result. In general, the LDPC code sequence is configured so that all are zero in a parity check.

Next, in Step S205, the inner code iterative decoding circuit 1 counts the non-zero-value count S for the parity check obtained in Step S204. Bits of the LDPC code sequence are sparsely distributed with respect to bits of a parity check. For instance, in an LDPC code used in DVB-S2, one bit out of most information bits affects only three bits of a parity check, and a redundant bit affects only two bits or one bit of a parity check.

That is, the non-zero-value count S in a parity check is high when there are many errors, and the non-zero-value count is low when there are few errors. When the weight of a redundant bit is 2 as in DVB-S2 and one redundant bit is an error, the non-zero-value count is 2. When many bit errors remain, however, the non-zero-value count may correlatively be small.

Next, in Step S206, the inner code iterative control circuit 2 receives the non-zero-value count S from the inner code iterative decoding circuit 1, and compares the received non-zero-value count S and the threshold parameter E[i] at the iteration count "i".

When "S<E[i]" is true, the inner code iterative control circuit 2 determines that an error remains in a redundant bit but is correctable with the subsequent block code, stops the iterative decoding processing, and proceeds to the processing of Step S210 and subsequent steps. The inner code iterative control circuit 2 stops the iterative decoding processing also when the non-zero-value count is 0, because the LDPC code sequence in this case is a sequence that follows an encoding rule and it can accordingly be determined that correction is complete.

The inner code iterative control circuit 2 may stop the iterative processing after executing the iterative processing once more when it is determined in Step S206 that the iterative processing is to be stopped, on condition that the iteration count "i" be a number other than the maximum iteration count and that the non-zero-value count be not 0.

When the iteration count "i" is relatively low, the non-zero-value count may be small due to correlation with a plurality of bit errors. A condition for stopping the iterative processing is therefore recommended to be strict. For example, the inner code iterative control circuit 2 may be designed so as to stop the iterative processing only when the non-zero-value count S is 0 (that is, when E[i]=1 is set) at the iteration count "i" that is equal to or lower than an iteration count set in advance.

The inner code iterative control circuit 2 may also be designed so as to stop the iterative processing when the iteration count "i" is higher than the iteration count set in advance and the non-zero-value count S in a parity check is lower than a non-zero-value count of a fixed value (that is, set to a fixed value that satisfies "E[i]>1").

When determining that the answer is "No" in Step S206 and proceeding to processing of Step S207, the inner code iterative control circuit 2 compares the non-zero-value count S and the threshold parameter F[i] at the iteration count "i".

When the comparison reveals that "S>F[i]" is true, the inner code iterative control circuit 2 determines that this is an uncorrectable state in which an error remains after the iterative processing repeated until the maximum iteration count is reached, and is uncorrectable also by decoding with the subsequent block code, stops the iterative decoding processing, and proceeds to the processing of Step S210 and subsequent steps. In short, when a stopping condition defined as "S>F[i]" is satisfied, the inner code iterative control circuit 2 stops the iterative decoding processing and proceeds to the processing of Step S210 and subsequent steps.

When it is determined in Step S207 that the iterative processing is to be stopped, with the iteration count "i" being short of the maximum iteration count, the inner code iterative control circuit 2 may stop the iterative processing after executing the iterative processing once more.

When the condition for stopping the iterative processing is satisfied in none of Step S203, Step S206, and Step S207 described above, the inner code iterative control circuit 2 proceeds to processing of Step S208 and subsequent steps in order to prepare for the next round of iterative processing. That is, the inner code iterative control circuit 2 increases the iteration count "i" by 1 in Step S208, performs row (check node) operation in Step S209, and then returns to the processing of Step S202 in order to perform column (variable node) operation again.

When the condition for stopping the iterative processing is satisfied in one of Step S203, Step S206, and Step S207, and Step S210 is consequently reached, the inner code iterative decoding circuit 1 sets a temporary hard-decision sequence as a decoding result, and outputs the set decoding result.

The determination of "Yes" in Step S203 corresponds to a case in which the iterative decoding processing is normally stopped after the maximum iteration count is reached, without being stopped in the middle of the run. The determination of "Yes" in Step S206 and Step S207 corresponds to a case in which the iterative decoding processing is stopped in the middle of the run, without the number of times of execution reaching the maximum iteration count.

Next, in Step S211, the outer code decoding circuit uses the temporary hard-decision sequence received as a decoding result from the inner code iterative decoding circuit 1 to execute decoding processing of the subsequent block (BCH) code, which is an outer code. As a result, the remaining error is corrected by the decoding operation in the outer code decoding circuit 4, and the series of processing steps of error correction is ended.

When the iterative decoding processing is stopped based on the result of the comparison in Step S206, or the result of the comparison in Step S207, the situation at that time serves as a material for an estimation of the state of a transmission path along which the LDPC code sequence has been received.

The inner code iterative control circuit 2 therefore feeds an iteration count at the time of stop of the iterative decoding processing and other types of information back to the parameter generation circuit 3 as iterative decoding stopping information. The parameter generation circuit 3 can execute update processing that decreases the maximum iteration count, update processing of the threshold used for the determination of whether to stop the iterative processing, and the like by estimating an error state of the next LDPC code sequence based on the iterative decoding stopping information fed back thereto.

As a result, power consumed by the error correction decoding device can be suppressed by executing parameter updating processing for each round of iteration based on the iterative decoding stopping information fed back in a situation in which correction is not possible.

The parameter generation circuit 3 can also obtain, as correction information fed back thereto, the number of corrected bits and notification of the uncorrectable state which are generated as a result of execution of the outer code decoding processing by the outer code decoding circuit 4. The parameter generation circuit 3 can accordingly execute update processing that decreases the maximum iteration count, update processing of the threshold used for the determination of whether to stop the iterative processing, and the like by estimating an error state of an LDPC code sequence to be input next, based on the correction information fed back from the outer code decoding circuit 4.

As a result, power consumed by the error correction decoding device can be suppressed by executing parameter updating processing for each round of iteration based on the correction information fed back in a situation in which correction is not possible.

Of the steps illustrated in FIG. 2, Step S202 to Step S209 correspond to an iterative decoding step. Step S201 executed in the iterative decoding processing corresponds to a parameter generation step, Step S203 corresponds to a normal stop step, and Step S206 and Step S207 correspond to both of a parameter reception step and a halfway stop step.

As described above, the error correction decoding device according to the first embodiment has a configuration in which the threshold set for each round of iteration and the non-zero-value count obtained through a parity check are compared each time the iteration count increases, and whether to stop the iterative processing can be determined based on the result of the comparison. The error correction decoding device according to the first embodiment consequently accomplishes effects described below.

(Effect 1)

In decoding of an LDPC code, stopping of iterative decoding can be executed by determining at an early stage that correction is not possible despite iterative decoding executed the maximum number of times in a syndrome check performed on a decoding result of each round of iteration, at the same time as processing of stopping the iterative decoding as a result of determining in the syndrome check that correction is complete.

(Effect 2)

The fact that the reception state is abnormal can be notified also to upstream circuits that execute demodulation, synchronization acquisition, and the like, as feedback information. The maximum iteration count can consequently be decreased so as to suppress iterative decoding processing for the subsequent LDPC code sequence that is rendered useless by the abnormal reception state.

(Effect 3)

The iterative decoding processing can be stopped rather early when it is determined that an error remaining in a preset parity check state after the iterative decoding processing is executed a preset number of times is an error correctable with a decoded part of the LDPC or by subsequent decoding processing.

With the configuration and effects described above, the error correction decoding device according to the first embodiment can reduce the number of times of the iterative decoding processing of the LDPC code by making most of the correction capability of the outer code decoding circuit relatively small in power consumption, and can accordingly suppress power consumption in decoding processing.

Second Embodiment

The preceding description of the first embodiment is focused on a case of suppressing power consumption by controlling the number of times of iteration in iterative decoding processing of an LDPC code sequence. A second embodiment of the present invention, on the other hand, gives description on a case of suppressing power consumption by aborting decoding processing in the middle of the run when an error uncorrectable even in decoding processing with the subsequent block code occurs.

Figure 3:
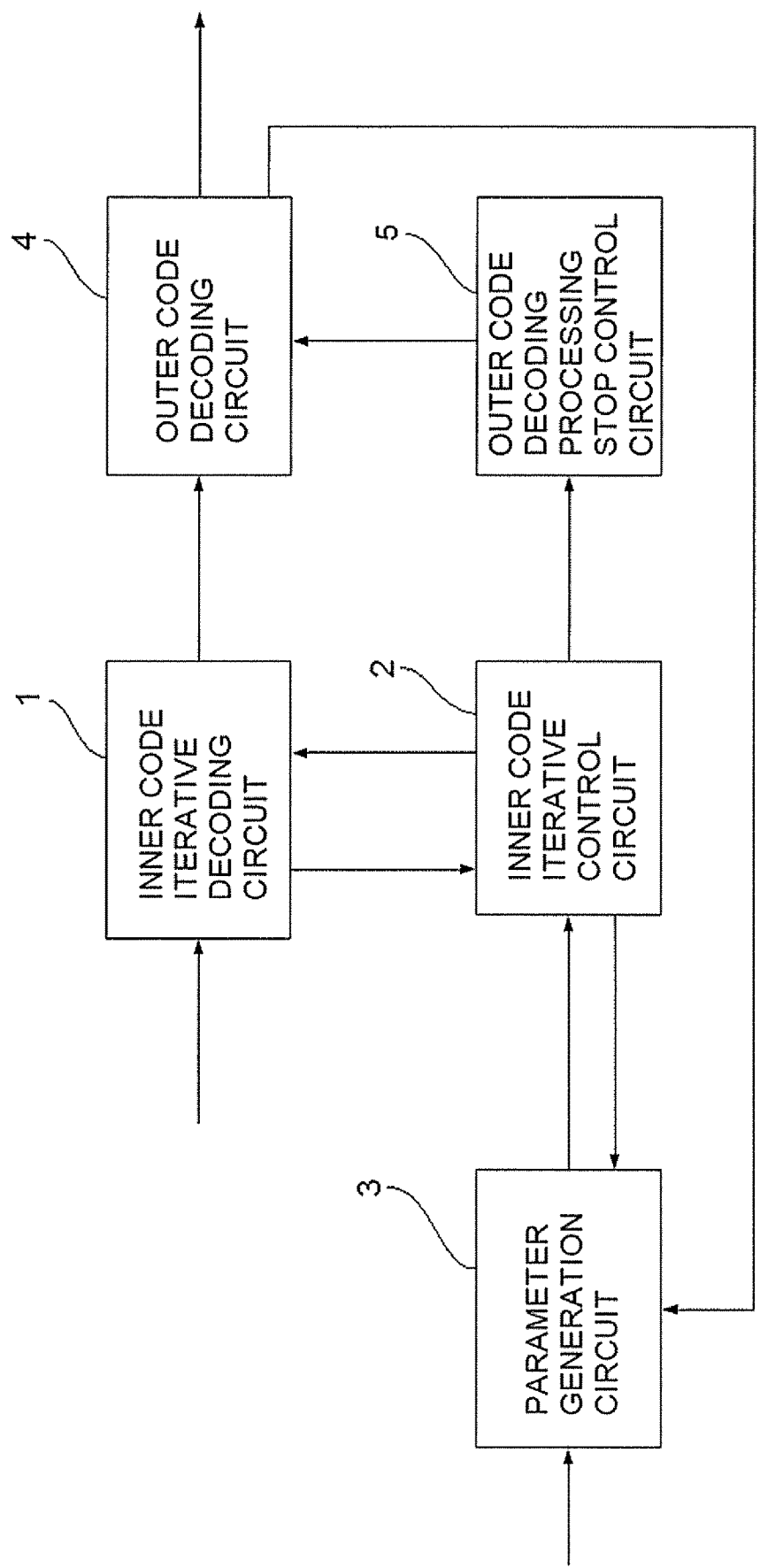
FIG. 3 is a block diagram for illustrating a configuration example of an error correction decoding device according to a second embodiment of the present invention.

FIG. 3 is a block diagram for illustrating a configuration example of an error correction decoding device according to the second embodiment of the present invention. The error correction decoding device according to the second embodiment includes the inner code iterative decoding circuit 1, the inner code iterative control circuit 2, the parameter generation circuit 3, the outer code decoding circuit 4, and an outer code decoding processing stop control circuit 5.

The configuration of FIG. 3 in the second embodiment differs from the configuration of FIG. 1 in the preceding first embodiment in that the outer code decoding processing stop control circuit 5 which is a second control circuit is further included. The following description is focused on this difference.

The outer code decoding processing stop control circuit 5 has a function of receiving an abnormality detection flag from the inner code iterative control circuit 2. The inner code iterative control circuit 2 can set the abnormality detection flag in the uncorrectable state determination, based on an abnormality determination iteration count K set in advance. The outer code decoding processing stop control circuit 5 further has a function of aborting the decoding operation that is executed by the outer code decoding circuit 4, by issuing a decoding processing stopping signal to the outer code decoding circuit 4 based on the received abnormality detection flag.

Figure 4:
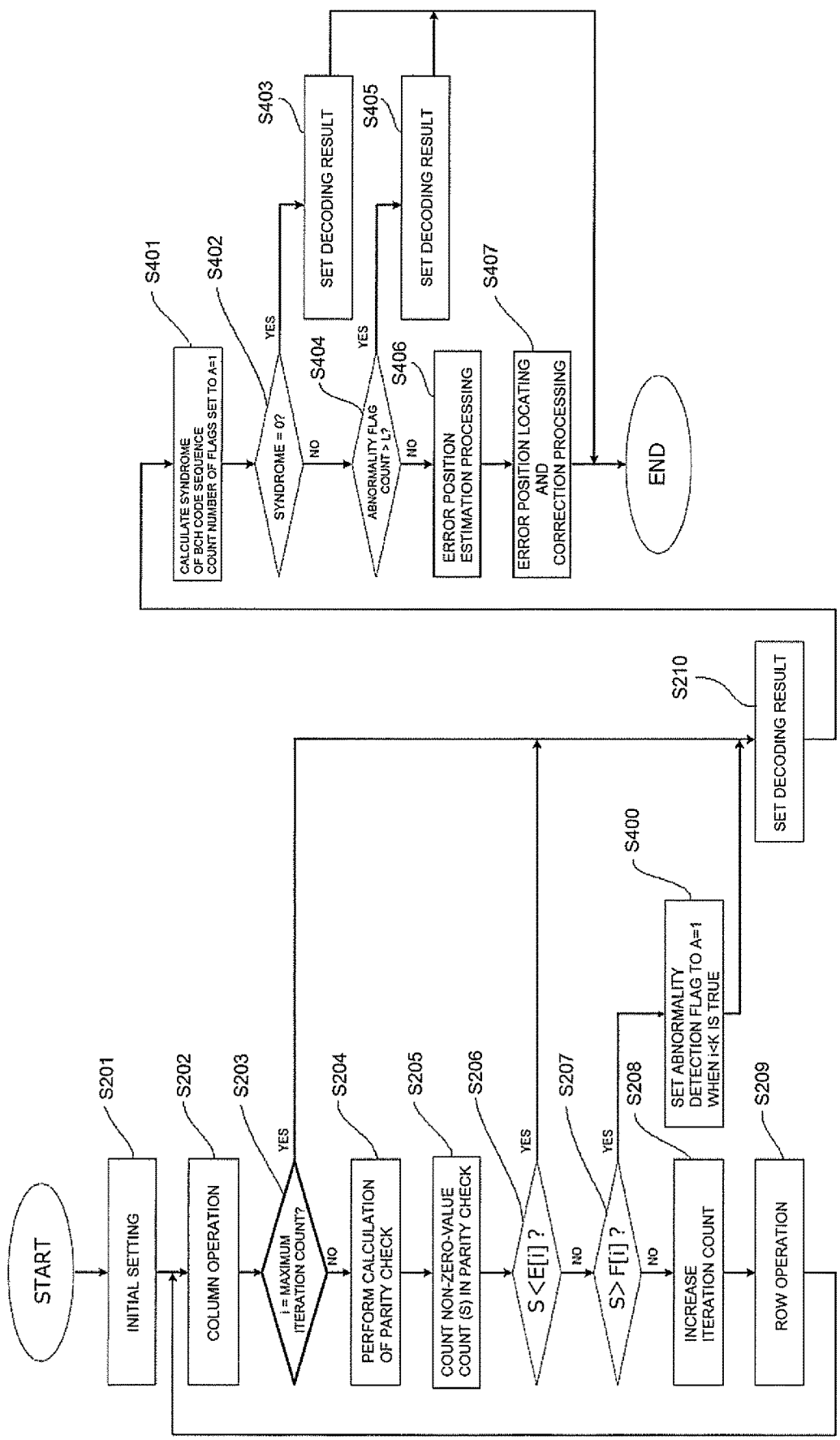
FIG. 4 is a flow chart for illustrating a series of processing steps to be executed by the error correction decoding device according to the second embodiment of the present invention which is illustrated in FIG. 3.

FIG. 4 is a flow chart for illustrating a series of processing steps to be executed by the error correction decoding device according to the second embodiment of the present invention which is illustrated in FIG. 3. More specifically, a series of processing steps to be executed by the components included in the error correction decoding device in the configuration of FIG. 3, namely, the inner code iterative decoding circuit 1, the inner code iterative control circuit 2, the parameter generation circuit 3, the outer code decoding circuit 4, and the outer code decoding processing stop control circuit 5, is illustrated in FIG. 4.

Decoding processing of an LDPC code sequence is the same as the processing illustrated in FIG. 2 in the preceding first embodiment, and is illustrated in FIG. 4 as Step S201 to Step S209 with the use of the same step numbers. Step S400 to Step S407 in FIG. 4 are processing newly added to the flow chart of FIG. 2. Step S400 to Step S407 are therefore described in detail below.

The inner code iterative control circuit 2 compares the threshold parameter F[i] at the iteration count "i" and the non-zero-value count S in Step S207 and, when "S>F[i]" is true, proceeds to processing of Step S400. A case in which the answer is determined to be "Yes" in Step S207 corresponds to a case in which an error may remain despite the inner code iterative decoding processing repeated until the maximum iteration count is reached, and may remain uncorrectable even in decoding with the subsequent block code.

The inner code iterative control circuit 2 therefore determines, after stopping the iterative decoding processing in Step S400, whether the iteration count "i" at the time of stopping the iterative decoding processing is smaller than the abnormality determination iteration count K set in advance by the parameter generation circuit 3. When "i<K" is true, the inner code iterative control circuit 2 determines that the LDPC code sequence is in an abnormal state, for example, a state in which data out of synchronization is input thereto, and sets an abnormality detection flag A to 1.

The inner code iterative control circuit 2 then hands the abnormality detection flag A to the outer code decoding processing stop control circuit 5 in time with the handing of a temporary hard-decision sequence as the result of the decoding of the LDPC code from the inner code iterative decoding circuit 1 to the outer code decoding circuit 4 which executes decoding processing with the subsequent block code.

Next, the inner code iterative decoding circuit 1 sets a temporary hard-decision sequence as the decoding result in Step S210, and outputs the set decoding result. Next, in Step S401, the outer code decoding circuit 4 selects a BCH code sequence part from the result of the decoding of the LDPC code, and performs syndrome operation first.

When the BCH code sequence is included in a plurality of LDPC code sequences, the outer code decoding circuit 4 inputs all included parts. The outer code decoding processing stop control circuit 5 in this case receives, from the inner code iterative control circuit 2, the abnormality detection flag A for each of the plurality of LDPC code sequences as abnormality detection flags that correspond to the plurality of LDPC code sequences on a one-to-one basis.

The outer code decoding circuit 4 normally performs, on the BCH code sequence part, the syndrome operation in Step S401, syndrome determination in Step S402, error position estimation processing using a Euclidean operation method or the like in Step S406, and error position locating and correction processing using Chien search or the like in Step S407, to thereby finish the series of error correction decoding processing steps.

The series of steps is processing executed even when an error is uncorrectable. In processing of a block code high in correction capability, for example, a BCH code, in particular, error position estimation processing of Step S406 and error position locating and correction processing of Step S407 are large in processing amount.

On the other hand, with a BCH code and other block codes, the range of the number of correctable errors is clear and, when the number of remaining errors is outside the range, uncorrectability is detected or the errors are incorrectly corrected. In the second embodiment, the abnormality detection flag A received by the outer code decoding processing stop control circuit 5 from the inner code iterative control circuit 2 is therefore used to estimate an error state in advance.

Further reduction of power consumption is aimed in the second embodiment by, as described later, referring to the abnormality detection flag A to determine whether syndrome operation is to be stopped before the start of the operation or in the middle of the operation.

Specifically, the outer code decoding circuit 4 executes syndrome operation of a BCH code sequence in Step S401 when the BCH code sequence is included in a plurality of LDPC code sequences. The outer code decoding processing stop control circuit 5 simultaneously counts the number of LDPC code sequences corresponding to the abnormality detection flag A that satisfies A=1, out of the plurality of LDPC code sequences in which the BCH code sequence is included.

Next, with a syndrome of the BCH code sequence obtained, the outer code decoding circuit 4 first determines in Step S402 whether values of the syndrome are all zero, namely, whether there is no error. The outer code decoding circuit 4 proceeds to Step S403 when it is determined that values of the syndrome are all zero and that there is accordingly no error, and proceeds to Step S404 when it is determined that the syndrome is non-zero and that there is accordingly an error.

When proceeding to Step S403, the outer code decoding circuit 4 determines that error correction by the inner code iterative decoding circuit 1 is complete, sets a BHC code input sequence as the result of the decoding, and ends the decoding processing.

When proceeding to Step S404, on the other hand, the outer code decoding circuit 4 determines that an error remains because the syndrome is non-zero, and determines whether the count of flags each serving as the abnormality detection flag A and satisfying A=1 is higher than a determination count L set in advance. The outer code decoding circuit 4 proceeds to Step S405 when the count of flags each serving as the abnormality detection flag A and satisfying A=1 is higher than the determination count L, and proceeds to Step S406 when the count of flags each serving as the abnormality detection flag A and satisfying A=1 is equal to or lower than the determination count L.

When proceeding to Step S405, the outer code decoding circuit 4 determines that correction by decoding with the BCH code which is the outer code is not possible, and ends the decoding processing. That is, when it is determined that correction is not possible, the decoding processing can be ended without executing the error position estimation processing of Step S406 and the error position locating and correction processing of Step S407.

When the processing proceeds to Step S406, on the other hand, the error position estimation processing using a Euclidean operation method or the like in Step S406 and the error position locating and correction processing using Chien search or the like in Step S407 are executed, and the series of error correction decoding processing steps is then ended.

As described above, the error correction decoding device according to the second embodiment has a configuration in which advance error situation estimation using abnormality detection flags is executed in the upstream inner code iterative control circuit, and whether to execute outer code decoding processing is determined in the downstream outer code decoding processing stop control circuit, based on the result of the estimation. As a result, the error correction decoding device according to the second embodiment can save power consumed in an uncorrectable state in which power consumption is large, by not being required to uselessly execute decoding processing for an error uncorrectable by the outer code decoding processing, in addition to having the effects of the preceding first embodiment.

In the second embodiment, a case in which a BCH code sequence is included in a plurality of LDCP code sequences and whether to execute outer code decoding processing is determined after syndrome operation of the BCH code sequence is performed is described. However, the error correction decoding device according to the second embodiment is not limited to this processing.

The error correction decoding device according to the second embodiment may also determine whether to execute outer code decoding processing before or in the middle of syndrome operation, by counting the number of flags each serving as the abnormality detection flag A and satisfying A=1, and comparing the counted number and the determination count L. Syndrome operation can be stopped before the start of the operation or in the middle of the operation when an error is determined to be uncorrectable, by employing this processing.

When there are a BHC code sequence that is an outer code and an LDPC code sequence that is an inner code on a one-to-one basis, the outer code decoding processing stop control circuit 5 can execute control processing described below. That is, the outer code decoding processing stop control circuit 5 receives the abnormality detection flag A at the same time as the start of syndrome operation of the BCH code sequence, or before the start of the syndrome operation, from the inner code iterative control circuit 2, and determines whether to execute outer code decoding processing.

When determining that the outer code decoding processing is not to be executed, the outer code decoding processing stop control circuit 5 stops the syndrome operation processing, determines that the error is uncorrectable by decoding with the BCH code that is an outer code, and can end the decoding processing.

In the second embodiment described above, there is described a case in which control for stopping outer code decoding processing is performed by setting the abnormality detection flag A to A=1 when the iteration count at the time when the iterative decoding processing is ended is lower than the abnormality determination iteration count K, in determination of abnormal ending in the inner code iterative decoding processing. However, the error correction decoding device according to the second embodiment is not limited to this processing.

Processing in which detail information, for example, the iteration count of the inner code at the time of abnormal ending, is handed from the inner code iterative control circuit 2 to the outer code decoding processing stop control circuit 5 may be executed. In this case, the outer code decoding processing stop control circuit 5 may perform finer control based on the iteration count of the inner code, in control of stopping processing for stopping outer code decoding processing, control of the stopping condition, and control for determining whether to stop during syndrome calculation or after a syndrome check.

Although the outer code in the description of the second embodiment is a BCH code, it is to be understood that the same control processing is possible with an outer code that is a block code other than a BCH code, for example, a Reed-Solomon code.

Figure 5:
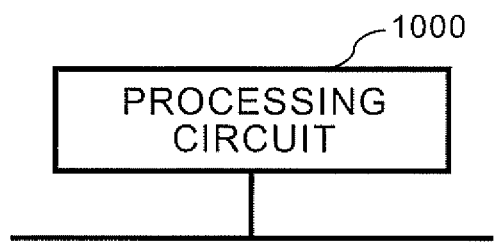
FIG. 5 is a diagram for illustrating a configuration for a case in which functions of the error correction decoding devices according to the first and second embodiments of the present invention are implemented by a processing circuit that is a dedicated piece of hardware.
Figure 6:
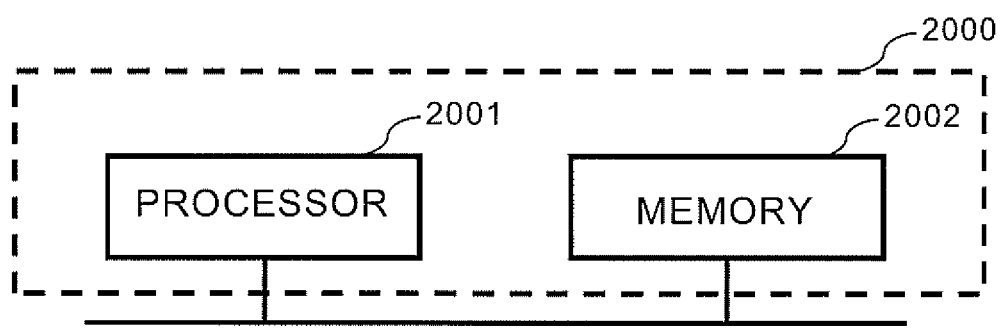
FIG. 6 is a diagram for illustrating a configuration for a case in which functions of the error correction decoding devices according to the first and second embodiments of the present invention are implemented by a processing circuit that includes a processor and a memory.

The functions in the error correction decoding devices according to the first and second embodiments described above are implemented by a processing circuit. The processing circuit implementing the functions may be a dedicated piece of hardware, or a processor configured to execute a program stored in a memory. FIG. 5 is a diagram for illustrating a configuration for a case in which the functions of the error correction decoding devices according to the first and second embodiments of the present invention are implemented by a processing circuit 1000 which is a dedicated piece of hardware. FIG. 6 is a diagram for illustrating a configuration for a case in which the functions of the error correction decoding devices according to the first and second embodiments of the present invention are implemented by a processing circuit 2000 which includes a processor 2001 and a memory 2002.

When the processing circuit is a dedicated piece of hardware, the processing circuit 1000 corresponds to, for example, a single circuit, a composite circuit, a programmed processor, a parallel-programmed processor, an application specific integrated circuit (ASIC), a field programmable gate array (FPGA), or a combination thereof. Functions of respective units in the inner code iterative decoding circuit 1, the inner code iterative control circuit 2, the parameter generation circuit 3, and the outer code decoding circuit 4 which are illustrated in FIG. 1, or functions of respective units in the inner code iterative decoding circuit 1, the inner code iterative control circuit 2, the parameter generation circuit 3, the outer code decoding circuit 4, and the outer code decoding processing stop control circuit 5 which are illustrated in FIG. 3, may each be implemented by the individual processing circuit 1000, or the functions of respective units may be implemented together by one processing circuit 1000.

When the processing circuit is the processor 2001, on the other hand, the functions of the respective units in the inner code iterative decoding circuit 1, the inner code iterative control circuit 2, the parameter generation circuit 3, the outer code decoding circuit 4, and the outer code decoding processing stopping control circuit 5 are implemented by software, firmware, or a combination of software and firmware. The software and the firmware are written as programs and stored in the memory 2002.

The processor 2001 implements the functions of the respective units by reading and executing the programs stored in the memory 2002. That is, the error correction decoding devices each include the memory 2002 for storing a program for causing, when run by the processing circuit 2000, the steps illustrated in FIG. 2 as an example, or the steps illustrated in FIG. 4, to be consequently executed.

It is also understood that those programs cause a computer to execute the steps and methods described above for the respective units. In this case, the memory 2002 corresponds to, for example, a random access memory (RAM), a read only memory (ROM), a flash memory, an erasable programmable read only memory (EPROM), an electrically erasable and programmable read only memory (EEPROM), or other such non-volatile or volatile semiconductor memory. The memory 2002 also corresponds to, for example, a magnetic disk, a flexible disk, an optical disc, a compact disc, a MiniDisk, or a DVD.

Some of the functions of the respective units described above may be implemented by a dedicated piece of hardware, and others thereof may be implemented by software or firmware.

In this manner, the processing circuit can implement the function of each of the units described above by hardware, software, firmware, or a combination thereof.

REFERENCE SIGNS LIST

1 inner code iterative decoding circuit (iterative decoding circuit), 2 inner code iterative control circuit (first control circuit), 3 parameter generation circuit, 4 outer code decoding circuit, 5 outer code decoding processing stop control circuit (second control circuit)

The invention claimed is:

1. An error correction decoding device, comprising:
   an iterative decoding circuit configured to execute iterative decoding processing for an LDPC code, sequentially output a temporary hard-decision decoding result for each iteration count, and to sequentially output a non-zero-value count that is obtained by executing a parity check for the temporary hard-decision decoding result, the non-zero-value count being a number based on errors in the parity check;
   a parameter generation circuit configured to generate, as a parameter for executing the iterative decoding processing, a threshold which is set for each iteration count; and
   a first control circuit configured to control iterative operation of the iterative decoding circuit,
   wherein the first control circuit is configured to:
   receive the threshold which is generated by the parameter generation circuit;
   and
   compare, when an iteration count does not reach a maximum iteration count, the non-zero-value count sequentially output from the iterative decoding circuit and the threshold which is set for each iteration count, and stop the iterative operation by the iterative decoding circuit to output the temporary hard-decision decoding result as a decoding result when a result of the comparison satisfies a stopping condition set in advance.

2. The error correction decoding device according to claim 1, wherein the parameter generation circuit is configured to generate the threshold based on a code length of the LDPC code and a parity bit length.

3. The error correction decoding device according to claim 1,
wherein the parameter generation circuit is configured to generate, as the threshold, for each iteration count, a first threshold to be used to determine correctability, and
wherein the first control circuit is configured to compare the non-zero-value count sequentially output from the iterative decoding circuit and the first threshold which is set for each iteration count, and stop the iterative operation by the iterative decoding circuit when the non-zero-value count is higher than the first threshold.

4. The error correction decoding device according to claim 1,
wherein the first control circuit is configured to feed, when the iterative operation by the iterative decoding circuit is stopped under a state in which an iteration count does not reach a maximum iteration count, information including a repetition count at a time when the iterative operation is stopped back to the parameter generation circuit, as iterative decoding stopping information, and
wherein the parameter generation circuit is configured to update, based on the iterative decoding stopping information, the parameter to be used when the iterative decoding circuit executes the iterative decoding processing for an LDPC code sequence received next.

5. The error correction decoding device according to claim 1, further comprising an outer code decoding circuit provided downstream of the iterative decoding circuit in order to execute outer code decoding processing for correcting an error that remains in a result of decoding in the iterative decoding circuit,
wherein the outer code decoding circuit is configured to generate, as a result of execution of the outer code decoding processing, correction information indicating the number of corrected bits and notification of an uncorrectable state, and feed the correction information back to the parameter generation circuit, and
wherein the parameter generation circuit is configured to update, based on the correction information, the parameter to be used when the iterative decoding circuit executes the iterative decoding processing for an LDPC code sequence received next.

6. The error correction decoding device according to claim 1, further comprising a second control circuit configured to control decoding operation by an outer code decoding circuit,
wherein the first control circuit is configured to set an abnormality detection flag when the iteration count at a time when the iterative operation by the iterative decoding circuit is stopped is lower than a determination count set in advance, and transmit the abnormality detection flag to the second control circuit, and
wherein the second control circuit is configured to determine, based on the abnormality detection flag, whether an uncorrectable error remains in the result of the decoding in the iterative decoding circuit, and perform control of stopping the decoding operation by the outer code decoding circuit when determining that the uncorrectable error remains.

7. The error correction decoding device according to claim 1,
wherein the parameter generation circuit is configured to generate, as the threshold, for each iteration count, a second threshold to be used to determine that the iterative operation by the iterative decoding circuit is complete, and
wherein the first control circuit is configured to compare the non-zero-value count sequentially output from the iterative decoding circuit and the second threshold set for each iteration count, and stop the iterative operation by the iterative decoding circuit when the non-zero-value count is lower than the second threshold.

8. An error correction decoding method which is executed by the error correction decoding device of claim 1, the error correction decoding method comprising:
executing iterative decoding processing for an LDPC code, sequentially outputting a temporary hard-decision decoding result for each iteration count, and sequentially outputting a non-zero-value count that is obtained by executing a parity check for the temporary hard-decision decoding result, the non-zero-value count being a number based on errors in the parity check;
generating, as a parameter for executing the iterative decoding processing, a threshold which is set for each iteration count;
receiving the threshold which is generated in the generating step;
stopping the iterative operation executed in the executing when an iteration count of the iterative decoding processing executed in the executing reaches the maximum iteration count; and
comparing, when the iteration count does not reach a maximum iteration count, the non-zero-value count sequentially output in the executing and the threshold which is set for each iteration count, and stopping the iterative operation executed in the executing to output the temporary hard-decision decoding result as a decoding result when a result of the comparison satisfies a stopping condition set in advance.

* * * * *